(12) United States Patent
Sivonen et al.

(10) Patent No.: US 12,375,044 B2
(45) Date of Patent: *Jul. 29, 2025

(54) LOW NOISE AMPLIFIER CIRCUIT

(71) Applicant: Telefonaktiebolaget LM Ericsson (publ), Stockholm (SE)

(72) Inventors: Pete Sivonen, Raisio (FI); Jarkko Jussila, Turku (FI); Sami Vilhonen, Lieto (FI)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 18/223,702

(22) Filed: Jul. 19, 2023

(65) Prior Publication Data

US 2023/0361723 A1 Nov. 9, 2023

Related U.S. Application Data

(63) Continuation of application No. 17/364,931, filed on Jul. 1, 2021, now abandoned, which is a continuation
(Continued)

(30) Foreign Application Priority Data

Feb. 28, 2014 (EP) .................................... 14157220

(51) Int. Cl.
*H03F 1/56* (2006.01)
*H03F 1/22* (2006.01)
(Continued)

(52) U.S. Cl.
CPC .............. *H03F 1/56* (2013.01); *H03F 1/223* (2013.01); *H03F 1/26* (2013.01); *H03F 3/193* (2013.01);
(Continued)

(58) Field of Classification Search
CPC ... H03F 1/56; H03F 1/223; H03F 1/26; H03F 3/193; H03F 3/265; H03F 2200/222;
(Continued)

(56) References Cited

U.S. PATENT DOCUMENTS 6,366,171 B1 4/2002 Litmanen et al.
6,407,640 B1 6/2002 Aparin et al.
(Continued)

FOREIGN PATENT DOCUMENTS

CN 101167245 A 4/2008
CN 101420204 A 4/2009
(Continued)

OTHER PUBLICATIONS

Choi, Jaeyi, et al., "A Low Noise and Low Power RF Front-End for 5.8-GHz DSRC Receiver in 0.13 μm CMOS," Journal of Semiconductor Technology and Science, vol. 11, Issue 1, Mar. 2011, The Institute of Electronics and Information Engineers of Korea, pp. 59-64.
(Continued)

*Primary Examiner* — Lana N Le
(74) *Attorney, Agent, or Firm* — Withrow & Terranova, PLLC

(57) ABSTRACT

An amplifier for converting a single-ended input signal to a differential output signal. The amplifier comprises a first transistor, a second transistor, a third transistor and a fourth transistor. The first transistor, configured in common-source or common-emitter mode, receives the single-ended input signal and generates a first part of the differential output signal. The second transistor, also configured in common-source or common-emitter mode, generates a second part of the differential output signal. The third and fourth transistors are capacitively cross-coupled. The amplifier further comprises inductive degeneration such that a source or emitter of
(Continued)

the first transistor is connected to a first inductor and a source or emitter of the second transistor is connected to a second inductor.

11 Claims, 6 Drawing Sheets

Related U.S. Application Data of application No. 16/563,436, filed on Sep. 6, 2019, now Pat. No. 11,057,005, which is a continuation of application No. 15/916,411, filed on Mar. 9, 2018, now Pat. No. 10,454,431, which is a continuation of application No. 15/120,304, filed as application No. PCT/EP2015/053728 on Feb. 23, 2015, now Pat. No. 9,948,248.

(51) Int. Cl.
  *H03F 1/26* (2006.01)
  *H03F 3/193* (2006.01)
  *H03F 3/26* (2006.01)
  *H04B 1/10* (2006.01)

(52) U.S. Cl.
  CPC ........... *H03F 3/265* (2013.01); *H04B 1/1036* (2013.01); *H03F 2200/222* (2013.01); *H03F 2200/294* (2013.01); *H03F 2200/387* (2013.01); *H03F 2200/451* (2013.01); *H03F 2200/489* (2013.01); *H03F 2200/54* (2013.01); *H03F 2200/87* (2013.01)

(58) Field of Classification Search
  CPC ......... H03F 2200/294; H03F 2200/387; H03F 2200/451; H03F 2200/489; H03F 2200/54; H03F 2200/87; H03F 2200/372; H03F 3/195; H03F 1/3211; H03F 3/45179; H03F 2203/45544; H03F 1/3205; H03F 1/565; H03F 1/523; H03F 3/189; H04B 1/1036; H04B 1/40; H04B 17/20; H04B 1/18; H04B 1/0475; Y02D 30/70

See application file for complete search history.

(56) References Cited

U.S. PATENT DOCUMENTS

| | | | |
|---|---|---|---|
| 6,417,737 B1 | 7/2002 | Moloudi et al. | |
| 7,193,475 B2 | 3/2007 | Su et al. | |
| 7,355,479 B2 | 4/2008 | Van Der Heijden | |
| 7,646,250 B2 | 1/2010 | Mun et al. | |
| 8,175,566 B2 | 5/2012 | Tasic et al. | |
| 8,965,322 B2 | 2/2015 | Mu | |
| 9,154,356 B2 | 10/2015 | Tasic et al. | |
| 9,306,505 B2 | 4/2016 | Rivoirard | |
| 9,337,775 B1 | 5/2016 | Ilkov et al. | |
| 9,369,091 B2 | 6/2016 | Horng et al. | |
| 9,800,215 B2 | 10/2017 | Dai | |
| 9,948,248 B2* | 4/2018 | Sivonen | H03F 3/193 |
| 10,147,990 B2 | 12/2018 | Cebi | |
| 10,454,431 B2* | 10/2019 | Sivonen | H03F 1/56 |
| 11,057,005 B2* | 7/2021 | Sivonen | H04B 1/1036 |
| 2004/0130399 A1 | 7/2004 | Andreani et al. | |
| 2004/0145415 A1 | 7/2004 | Sun | |
| 2005/0186917 A1 | 8/2005 | Rofougaran et al. | |
| 2006/0128340 A1 | 6/2006 | Hsieh et al. | |
| 2006/0189286 A1 | 8/2006 | Kyu et al. | |
| 2007/0030076 A1 | 2/2007 | Kim et al. | |
| 2007/0188238 A1 | 8/2007 | Su et al. | |
| 2008/0191807 A1 | 8/2008 | Mun et al. | |
| 2008/0252381 A1 | 10/2008 | Sanduleanu et al. | |
| 2009/0153244 A1* | 6/2009 | Cabanillas | H03F 1/3211 |
| 2009/0174481 A1* | 7/2009 | Chang | H03F 1/223 |
| | | | 330/296 |
| 2010/0019848 A1 | 1/2010 | Rossi | |
| 2010/0033253 A1 | 2/2010 | Narathong et al. | |
| 2010/0060363 A1 | 3/2010 | Han et al. | |
| 2010/0148873 A1 | 6/2010 | Li et al. | |
| 2010/0259319 A1 | 10/2010 | Chan et al. | |
| 2010/0308914 A1 | 12/2010 | Kuo et al. | |
| 2010/0327887 A1 | 12/2010 | Denison et al. | |
| 2011/0109388 A1 | 5/2011 | Touzard et al. | |
| 2012/0154047 A1 | 6/2012 | Nakahashi et al. | |
| 2012/0208473 A1 | 8/2012 | Aparin | |
| 2015/0002225 A1* | 1/2015 | Mattisson | H03F 1/26 |
| | | | 330/293 |
| 2016/0072443 A1* | 3/2016 | Mizokami | H03F 3/193 |
| 2016/0072455 A1 | 3/2016 | Lin | |
| 2016/0072456 A1 | 3/2016 | Lin et al. | |
| 2016/0079946 A1* | 3/2016 | Rajendran | H03F 1/26 |
| | | | 455/127.3 |
| 2016/0336983 A1* | 11/2016 | Wang | H04B 1/1036 |
| 2017/0070197 A1 | 3/2017 | Sivonen et al. | |
| 2017/0163215 A1 | 6/2017 | Gorbachov et al. | |
| 2017/0179894 A1 | 6/2017 | Jin et al. | |
| 2018/0198422 A1 | 7/2018 | Sivonen et al. | |
| 2018/0219516 A1 | 8/2018 | Soliman | |
| 2019/0081597 A1* | 3/2019 | Jain | H01L 29/78 |
| 2019/0215030 A1 | 7/2019 | Nabki et al. | |
| 2019/0267951 A1 | 8/2019 | Kim et al. | |
| 2019/0372528 A1 | 12/2019 | Pal et al. | |
| 2019/0393844 A1 | 12/2019 | Sivonen et al. | |
| 2020/0350679 A1 | 11/2020 | Yu et al. | |
| 2020/0366325 A1 | 11/2020 | Medra et al. | |
| 2021/0044260 A1* | 2/2021 | Zeng | H03F 1/56 |
| 2021/0067115 A1 | 3/2021 | Karmaker et al. | |
| 2021/0126590 A1* | 4/2021 | Gong | H03F 3/45076 |
| 2022/0021353 A1 | 1/2022 | Han et al. | |
| 2022/0407469 A1* | 12/2022 | Ayranci | H03F 1/223 |
| 2023/0361797 A1* | 11/2023 | Chadalawada | H04B 1/10 |
| 2023/0370030 A1* | 11/2023 | Roeckner | H03F 3/193 |

FOREIGN PATENT DOCUMENTS

| | | |
|---|---|---|
| CN | 101647196 A | 2/2010 |
| CN | 101669289 A | 3/2010 |
| CN | 102946230 A | 2/2013 |
| EP | 2037573 A1 | 3/2009 |
| TW | 200845571 A | 11/2008 |

OTHER PUBLICATIONS

Im, Donggu, et al., "A CMOS Resistive Feedback Single to Differential Low Noise Amplifier with Multiple-Tuner-Outputs for a Digital TV Tuner," 2009 IEEE Radio Frequency Integrated Circuits Symposium, Jun. 7-9, 2009, Boston, Massachusetts, IEEE, pp. 555-558.

Moon, Hyunwon, et al., "A 23mW fully integrated GPS receiver with robust interferer rejection in 65nm CMOS," 2010 IEEE International Solid-State Circuits Conference (ISSCC), Feb. 7-11, 2010, San Francisco, California, IEEE, 26 pages.

Pan, Quan, et al., "A performance study of layout and Vt options for low noise amplifier design in 65-nm CMOS," 2012 IEEE Radio Frequency Integrated Circuits Symposium, Jun. 17-19, 2012, Montreal, Quebec, IEEE, pp. 535-538.

Sahu, Debapriya, et al., "17.1: A 90nm CMOS Single-Chip GPS Receiver with 5dBm Out-of-Band IIP3 2.0dB NF," 2005 IEEE International Solid-State Circuits Conference (ISSCC), Session 17, RF Cellular ICs, Feb. 8, 2005, Bangalore, India, IEEE, 3 pages.

Zhuo, Wei, et al., "Using Capacitive Cross-Coupling Technique in RF Low Noise Amplifiers and Down-Conversion Mixer Design," Proceedings of the 26rd European Solid-State Circuits Conference (ESSCIRC), Sep. 19-21, 2000, Stockholm, Sweden, IEEE, 4 pages.

Non-Final Office Action for U.S. Appl. No. 15/120,304, mailed Feb. 13, 2017, 10 pages.

Final Office Action for U.S. Appl. No. 15/120,304, mailed Jun. 2, 2017, 12 pages.

(56) References Cited

OTHER PUBLICATIONS

Non-Final Office Action for U.S. Appl. No. 15/916,411, mailed Jul. 27, 2018, 14 pages.
Final Office Action for U.S. Appl. No. 15/916,411, mailed Dec. 13, 2018, 16 pages.
Advisory Action for U.S. Appl. No. 15/916,411, mailed Mar. 28, 2019, 4 pages.
Notice of Allowance and Examiner-Initiated Interview Summary for U.S. Appl. No. 15/916,411, mailed Jun. 17, 2019, 7 pages.
Non-Final Office Action for U.S. Appl. No. 16/563,436, mailed Mar. 25, 2020, 9 pages.
Final Office Action for U.S. Appl. No. 16/563,436, mailed Jul. 9, 2020, 18 pages.
Advisory Action for U.S. Appl. No. 16/563,436, mailed Oct. 20, 2020, 3 pages.
Non-Final Office Action for U.S. Appl. No. 16/563,436, mailed Nov. 18, 2020, 14 pages.
International Search Report and Written Opinion for International Patent Application No. PCT/EP2015/053728, mailed May 8, 2015, 10 pages.
Supplementary Search for Chinese Patent Application No. 201580010971.7, mailed Jan. 4, 2018, 2 pages.
First Office Action for Chinese Patent Application No. 201580010971.7, mailed Jan. 17, 2018, 4 pages.
Extended European Search Report for European Patent Application No. 14157220.6, mailed Jul. 7, 2014, 6 pages.
Examination Report for European Patent Application No. 14157220.6, mailed Aug. 15, 2018, 9 pages.
Summons to Attend Oral Proceedings for European Patent Application No. 14157220.6, mailed Jan. 23, 2019, 11 pages.
Decision to Refuse for European Patent Application No. 14157220.6, mailed Mar. 8, 2019, 5 pages.
Non-Final Office Action and Examiner-Initiated Interview Summary for U.S. Appl. No. 17/364,931, mailed Jul. 22, 2022, 20 pages.
Final Office Action and Examiner-Initiated Interview Summary for U.S. Appl. No. 17/634,931, mailed Jan. 9, 2023, 60 pages.
Notice of Allowance for U.S. Appl. No. 17/364,931, mailed Apr. 19, 2023, 7 pages.
First Office Action for Chinese Patent Application No. 201810957771.8, mailed Dec. 9, 2021, 32 pages.

\* cited by examiner

LOW NOISE AMPLIFIER CIRCUIT

RELATED APPLICATIONS

This application is a continuation of U.S. patent application Ser. No. 17/364,931, filed Jul. 1, 2021, which is a continuation of U.S. patent application Ser. No. 16/563,436, filed Sep. 6, 2019, now U.S. Pat. No. 11,057,005, which is a continuation of U.S. patent application Ser. No. 15/916,411, filed Mar. 9, 2018, now U.S. Pat. No. 10,454,431, which is a continuation of U.S. patent application Ser. No. 15/120,304, filed Aug. 19, 2016, now U.S. Pat. No. 9,948,248, which is a 35 U.S.C. § 371 national phase filing of International Application No. PCT/EP2015/053728, filed Feb. 23, 2015, which claims the benefit of European Patent Application No. 14157220.6, filed Feb. 28, 2014, the disclosures of which are incorporated herein by reference in their entireties.

TECHNICAL FIELD

Embodiments herein relate to an amplifier. In particular, they relate to a low noise amplifier for converting a single-ended input signal to a differential output signal in a wireless communication device.

BACKGROUND

Transceivers, which in general comprise transmitters and receivers, employed in wireless communication devices, e.g. modern cellular phones, are usually highly integrated with most of the transceiver functions integrated on a Radio Frequency Integrated Circuit (RFIC). Highly integrated RFIC reduces phone's Printed Circuit Board (PCB) area, complexity and power consumption, while lowering cost of components. In addition, cellular receivers used in high-end mobile phones and laptops need to operate at multiple frequency bands and the cellular receivers have to support several wireless standards such as Global System for Mobile Communications (GSM), Wideband Code Division Multiple Access (WCDMA), and Long Term Evolution (LTE) etc.

As each reception frequency band usually needs its own pre-selection filter between an antenna and the RFIC, the number of receiver inputs of the RFIC is basically determined by the number of bands needed to be supported. In practice, state-of-the-art RFICs may have as many as 10 to 30 receiver inputs. Moreover, as differential signal processing is considered to be more insensitive and robust against common-mode disturbances and interferences, often differential inputs are employed for receiver RFICs. Naturally, a corresponding first stage of the RFIC receiver, usually a Low-Noise Amplifier (LNA), is also implemented as a differential-input, differential-output amplifier. Unfortunately, as each differential LNA needs two input package pins, the number of RFIC package pins consumed by the receiver inputs will increase largely assuming that a large number of frequency bands needs to be supported. For instance, with 20 differential receiver inputs, altogether 40 package pins for the receiver inputs are needed in the RFIC. In addition, routing 20 differential Radio Frequency (RF) traces on PCB between the RFIC and a Front-End Module (FEM) containing pre-selection filters etc. becomes very challenging. For this reason, it would be very beneficial to have an LNA with a single-ended input so as to lower the number of RFIC package pins needed for the receiver. In addition, this would simplify the PCB routing between the FEM and RFIC, and also lower the PCB area and footprint needed for the corresponding routing. On the other hand, due to electrical performance reasons it is very beneficial to implement a down-conversion mixer following the LNA in the receiver downstream as a double-balanced circuit, so the LNA needs to have a differential output. As a result, a single-ended-to-differential LNA is needed.

The single-ended-to-differential amplifier may be implemented by using a single-ended amplifier, i.e. an amplifier with single-ended input and output, followed by a passive or active balun circuit, which converts a single-ended output signal of the amplifier to a differential signal. Unfortunately, single-ended amplifiers are very sensitive to poorly modeled ground and supply parasitics, such as parasitic inductances, which may degrade amplifier gain, input matching, Noise Figure (NF) etc. and in some extreme cases may cause circuit oscillation. As very accurate modeling of ground and supply parasitics is needed for the single-ended amplifier design, there is also a risk of penalty in time-to-market due to a longer design cycle. Moreover, in a product containing the RFIC, customers or another subcontractors may design the PCB, therefore it would be beneficial to use LNAs that are less sensitive to PCB parasitics, e.g. supply and ground inductances. Finally, unavoidable ground and supply parasitic loops may also act as a victim loop for magnetic coupling of undesirable spurious signals.

Usually, a passive balun circuit is implemented as an inductive transformer. However, a passive balun circuit or transformer circuit used at the amplifier output has usually lower quality factor than a corresponding differential inductor, which leads to power consumption penalty. Moreover, active balun circuits degrade performance of a receiver by introducing noise and nonlinearity while also increasing power consumption of the receiver.

It is also possible to realize a single-ended-to-differential amplifier by employing a balun circuit followed by a differential amplifier, i.e. an amplifier with balanced or differential input and output. The balun circuit converts a single-ended input signal to a differential signal for the differential amplifier. A conventional balun circuit may be implemented either as an on- or off-chip inductive transformer. However, as the loss of the balun circuit is very critical regarding the receiver NF, the balun circuit is usually implemented as an off-chip component with high Quality factor (Q-factor) and low loss. Unfortunately, since each RFIC receiver input needs its own balun circuit and external balun circuits are almost as expensive as pre-selection filters, the solution is not attractive due to high cost and a large PCB area is consumed.

U.S. Pat. No. 6,366,171 discloses a single-ended-to-differential LNA which can be integrated on silicon, but in this technique, a compensation circuit is needed to improve the differential signal phase imbalance. In addition, the auxiliary branch needed to generate the differential output signal generates substantial noise and nonlinearity.

In U.S. Pat. No. 7,646,250 and CHOI, J. et al., A Low Noise and Low Power RF Front-End for 5.8-GHz DSRC Receiver in 0.13 um CMOS, *Journal of Semiconductor Technology and Science*, Vol. 11, No. 1, March 2011, single-to-differential signal converters with similar topology which can provide well-balanced output currents in response to a single-ended input voltage are disclosed. The topology is shown in FIG. 1, where the single-to-differential converter comprises a first transistor $M_1$ and a second transistor $M_2$, each configured as a common-source amplifier. Further, a capacitive cross-coupled transistor pair $M_3$ and $M_4$ is coupled to outputs of the first and second transistors $M_1$ and $M_2$. $Z_L$ is an LC-resonator circuit coupled at the output of the converter. Unfortunately, since this circuit has capacitive or imaginary input impedance, its input impedance cannot be matched to a real impedance, such as 50Ω, even with off-chip matching networks. As a result, the single-ended-to-differential converter shown in FIG. 1 cannot be used as an LNA in a wireless receiver as shown in FIG. 2 and described below, in which the LNA input impedance needs to be matched to a characteristic impedance, usually 50Ω, of a band-pass filter preceding the LNA.

In the wireless receiver shown in FIG. 2, an RF filter, or band pass filter, is needed to perform pre-selection of a received RF band. Without the RF filter, the linearity requirements of the receiver would be overwhelming and impractical. On the other hand, if the terminating impedance of the RF filter differs significantly from the specified characteristic impedance, it will cause large ripple and loss in the pass-band of the RF filter and worsen the transition band of the RF filter. Such large losses need to be avoided because they can, for example, lead to penalties in receiver NF and sensitivity. As a result, it is very important that the LNA presents sufficiently accurate terminating impedance for the RF filter.

SUMMARY

Therefore, a first object of embodiments herein is to provide a single-ended-to-differential amplifier with improved performance.

According to a first aspect of embodiments herein, the object is achieved by an amplifier for converting a single-ended input signal to a differential output signal. The amplifier according to embodiments herein comprises a first transistor, configured in common-source or common-emitter mode, to receive the single-ended input signal and generate a first part of the differential output signal. The amplifier further comprises a second transistor, configured in common-source or common-emitter mode, to generate a second part of the differential output signal. The amplifier further comprises a third transistor and a fourth transistor which are cross-coupled and connected to the first and second transistors in the following way:
  a drain or collector of the first transistor is coupled to a gate or base of the fourth transistor via a first capacitor;
  a drain or collector of the second transistor is coupled to a gate or base of the third transistor via a second capacitor; and
  the drain or collector of the first transistor is connected to a source or emitter of the third transistor, the drain or collector of the second transistor is connected to a source or emitter of the fourth transistor.

Further, the drain or collector of the first transistor is coupled to a gate or base of the second transistor directly or via a third capacitor.

The amplifier further comprises a degenerating inductance such that a source or emitter of the first transistor is connected to a first inductor and a source or emitter of the second transistor is connected to a second inductor.

A second object of embodiments herein is to provide a multiband receiver with improved performance.

According to an aspect of embodiments herein, this object is achieved by a receiver for operating at multiple frequency bands. The receiver comprises one or more radio-frequency filters configured to receive a single-ended input signal and to generate a single-ended output signal. The receiver further comprises one or more amplifiers according to embodiments herein configured to convert a single-ended input signal, being the single-ended output signal generated from the radio-frequency filter, to a differential output signal. Further, input impedances of the one or more amplifiers are configured to match output impedances of the one or more radio frequency filters at operating frequencies respectively.

According to another aspect of embodiments herein, this object is achieved by a method in a receiver for operating at multiple frequency bands. The method comprises receiving in one or more radio-frequency filters single-ended input signals and generating single-ended output signals. The method further comprises receiving the generated single-ended output signals in one or more amplifiers according embodiments herein and converting the received single-ended signals to differential output signals in the one or more amplifiers. Further, input impedances of the one or more amplifiers are configured to match output impedances of the one or more radio frequency filters at operating frequencies respectively.

The amplifier according to embodiments herein has several advantages. First, since the amplifier comprises a first transistor which is an inductively degenerated common-source or common-emitter transistor, together with an input matching circuit, it can provide a well-defined and well-regulated input impedance. Second, since the amplifier can provide a well-defined and well-regulated input impedance, its input impedance may be designed to match a characteristic impedance of an RF filter, then the amplifier is suitable for using as a low noise amplifier in a receiver in a wireless communication device. Third, since the amplifier comprises a third transistor and a fourth transistor which are cross-coupled and connected to the first and second transistors, the amplifier can provide a well-balanced differential output signal. In addition, thanks to the cross-coupled the third and fourth transistors, the noise and nonlinearity due to the second transistor in the amplifier are cancelled at the well-balanced differential output signal. As a result, the second transistor has negligible effect on the entire amplifier noise and linearity performance.

Thus, embodiments herein provide a single-ended-to-differential amplifier with improved performance on input impedance matching, noise and linearity. Further, embodiments herein also provide a multiband receiver with improved performance as a result of using the amplifier according to embodiments herein as a low noise amplifier in the receiver. Thanks to the improved performance on the input impedance matching, noise and nonlinearity of the amplifier, the entire receiver performance on, e.g. noise and linearity are improved.

BRIEF DESCRIPTION OF THE DRAWINGS

Examples of embodiments herein are described in more detail with reference to attached drawings in which.

DETAILED DESCRIPTION

Nowadays most receivers in wireless communication devices are based on direct conversion or zero Intermediate Frequency (zero-IF) architectures, because these receiver topologies allow a very high level of integration and low cost. Zero-IF receivers also permit efficient integration of multimode, multiband receivers.

Figure 1:
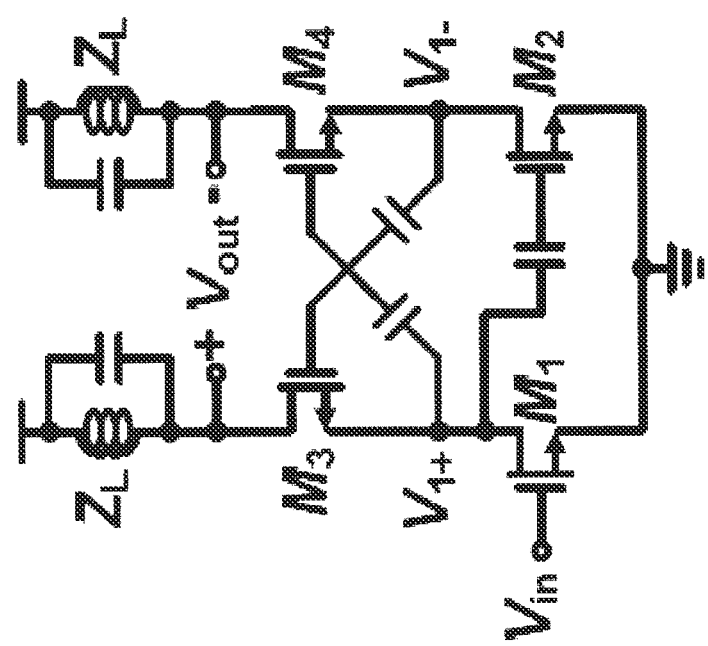
FIG. 1 is a schematic diagram illustrating a single-ended-to-differential amplifier with capacitive cross-coupled transistor pair according to prior art.
Figure 2:
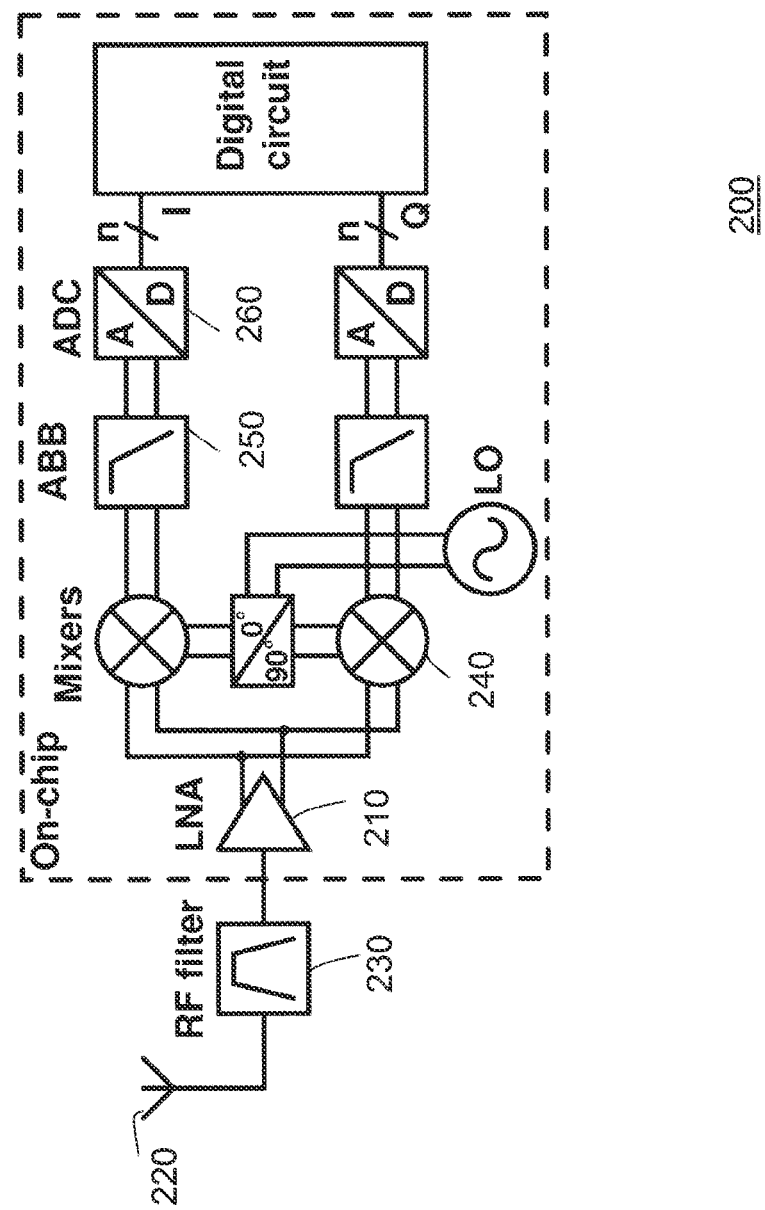
FIG. 2 is a schematic diagram illustrating a direct conversion receiver with a single-ended-to-differential LNA according to prior art.

A simplified block diagram of a direct conversion receiver 200 with a single-ended-to-differential LNA 210 is shown in FIG. 2. An antenna 220 feeds a received RF analog signal to a RF filter 230 that performs pre-selection of received RF bands and passes on a selected RF analog signal. The LNA 210 amplifies the selected RF analog signal and drives down-conversion mixers 240, mixers for short, which down-convert the amplified RF analog signal. The down-converted analog signal is filtered and amplified in low-pass filters and gain stages of Analog Baseband (ABB) 250 and then converted to a digital signal in Analog-to-Digital Converters (ADC) 260. As shown in FIG. 2, the selected RF signal at the LNA 210 input is single-ended but the remaining signal processing before the ADC 260 is carried out with differential signals.

The mixers 240 utilized in an integrated direct conversion receiver are practically always based either on single- or double-balanced circuit topologies. If a mixer operates with a differential Local Oscillator (LO) signal and a single-ended RF signal, it is called single-balanced. However, if a mixer accommodates both differential RF and LO signals, it is called double-balanced.

Double-balanced mixers generate less even-order distortion and provide better port-to-port isolation than their single-balanced counterparts. In addition, single-balanced topologies are more susceptible to noise in the LO signal. For these reasons, double-balanced mixer topologies are preferred and the LNA 210 needs to provide differential drive signals for the double-balanced mixer, as shown in FIG. 2. Embodiments herein is to provide LNA circuits that improve the performance of the receiver 200.

Figure 3:
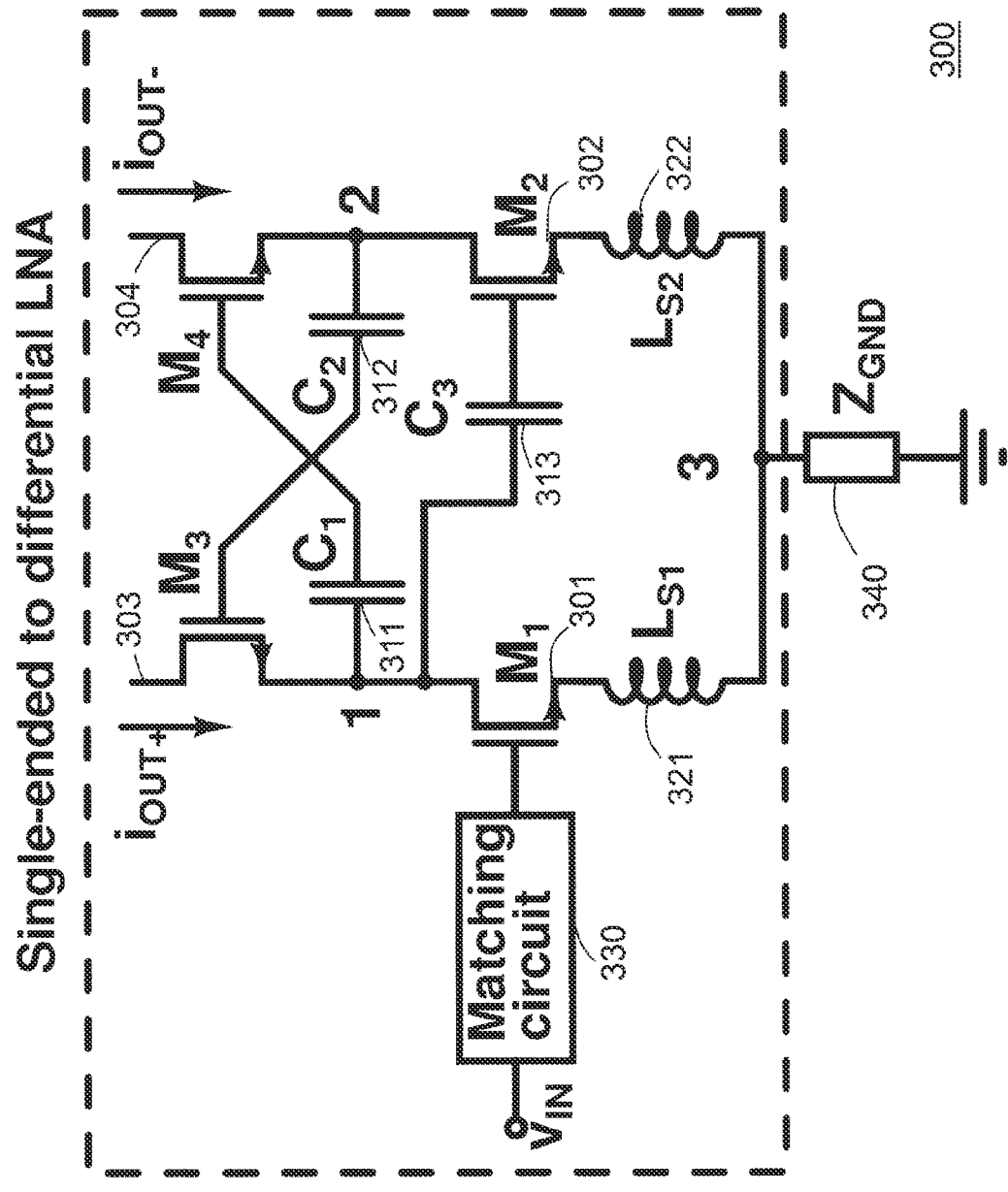
FIG. 3 is a schematic diagram illustrating a single-ended-to-differential amplifier according to embodiments herein.

According to embodiments herein, a single-ended-to differential amplifier 300 for converting a single-ended input signal to a differential output signal is shown in FIG. 3. FIG. 3 is a simplified schematic, where all biasing details are omitted. The amplifier 300 may be used as the LNA 210 in the receiver in FIG. 2.

As shown in FIG. 3, the amplifier 300 comprises a first transistor 301, $M_1$, a second transistor 302, $M_2$, a third transistor 303, $M_3$ and a fourth transistor 304, $M_4$. Although transistors shown in FIG. 3 are Metal-Oxide-Semiconductor (MOS) transistors with terminal names of gate, drain and source, it is also possible to use other types of transistor, for example, Bipolar Junction Transistors (BJT) with corresponding terminal names of base, collector and emitter.

The first transistor 301, configured in common-source or common-emitter mode, receives the single-ended input signal and generates a first part of the differential output signal, i.e. the output current $i_{OUT+}$. The second transistor 302, also configured in common-source or common-emitter mode, generates a second part of the differential output signal, i.e. the output current $i_{OUT-}$. The third and fourth transistors 303,304 are capacitively cross-coupled and connected to the first and second transistors 301,302.

Further, as shown in FIG. 3, detailed connections of the first, second, third and fourth transistors 301,302,303,304 are: a drain or collector of the first transistor 301 is coupled to a gate or base of the fourth transistor 304 via a first capacitor 311, $C_1$; a drain or collector of the second transistor 302 is coupled to a gate or base of the third transistor 303 via a second capacitor 312, $C_2$; further, the drain or collector of the first transistor 301 is coupled to a gate or base of the second transistor 302 via a third capacitor 313, $C_3$; and furthermore the drain or collector of the first transistor 301 is connected to a source or emitter of the third transistor 303, the drain or collector of the second transistor 302 is connected to a source or emitter of the fourth transistor 304.

According to some embodiments, the third capacitor $C_3$ may be replaced with a short circuit. In that case the gate or base of the second transistor 302 is directly connected to the drain or collector of the first transistor 301.

The amplifier 300 further comprises inductive degeneration such that a source or emitter of the first transistor 301 is connected to a first inductor 321, $LS_1$, and a source or emitter of the second transistor 302 is connected to a second inductor 322, $LS_2$.

According to some embodiments, degeneration inductors 321 and 322, i.e. $LS_1$ and $LS_2$, may also be implemented with a single differential inductor. Then, the amplifier 300 comprises a differential degenerating inductance such that the source or emitter of the first transistor 301 is connected to a first terminal of the differential inductor and the source or emitter of the second transistor 302 is connected to a second terminal of the differential inductor. Depending on the differential inductor topology, a middle access terminal of the differential inductor may be connected to a ground.

The amplifier 300 further comprises a matching circuit 330. The gate or base of the first transistor 301 is coupled to the single-ended input signal through the matching circuit 330. In FIG. 3, $Z_{GND}$ represents a parasitic ground impedance, ideally $Z_{GND}=0\Omega$. The matching circuit 330 is usually implemented with off-chip high-Quality (high-Q) passive components. Most often, one or two passive components are sufficient to match the amplifier input impedance at the frequency of interest to the impedance of an RF filter, e.g. 50Ω. The matching circuit 330 may comprise, for instance, starting from the gate of the first transistor 301, a series inductance and a parallel capacitance between the amplifier 300 input terminal, i.e. the terminal named $V_{IN}$ and the ground. In FIG. 3, the first, second and third capacitors 311,312,313, i.e. $C_1$, $C_2$, and $C_3$ are assumed to act as short-circuits at the operation frequency of interest.

At the frequency of interest, the input matching circuit 330 together with the first transistor 301, which is the inductively degenerated common-source transistor $M_1$, matches the amplifier 300 input impedance to the characteristic impedance of the RF filter 230. The first transistor 301 also amplifies the input voltage $V_{IN}$ across the gate-source of the first transistor 301. In the following, the first transistor 301, $M_1$, converts the amplified version of the input voltage $V_{IN}$ or its gate-source voltage $V_{GS1}$ to a first part of the differential output current $i_{OUT+}$. The second transistor 302, which is the common-source transistor $M_2$, is responsible for converting its gate-source voltage $V_{GS2}$ to a second part of, i.e. the complementary of the differential output current $i_{OUT-}$. Moreover, thanks to the cross-coupled third and fourth transistors 303,304, i.e. $M_3$ and $M_4$, the output currents $i_{OUT+}$ and $i_{OUT-}$ are well-balanced.

As a summary, the amplifier 300 being a single-ended-to-differential amplifier, converts the input signal, the voltage $v_{IN}$ applied via the input matching network 330 to the gate or base of the first transistor 301, $M_1$, to a differential output signal, i.e. the output current $i_{OUT}=i_{OUT+}-i_{OUT-}$, where $i_{OUT+}=i_{OUT-}$, available at the drains or collectors of the cross-coupled third and fourth transistors 303, 304, $M_3$ and $M_4$. At the output of the amplifier 300, the differential output current may be converted to a differential output voltage $v_{OUT}=Z_L*i_{OUT}$ by a load impedance $Z_L$ if needed.

Now, detailed operations of the single-ended-to-differential converting in the amplifier 300 are described. By inspection of the amplifier 300 in FIG. 3, the output currents can be written as $$i_{OUT+} = g_{m3}(v_2 - v_1) \qquad (1)$$

$$i_{OUT-} = g_{m4}(v_1 - v_2) \qquad (2)$$

Where, $v_1$ and $v_2$ are voltages at nodes 1 and 2, and $g_{m3}$, $g_{m4}$ are transconductances of the third transistor $M_3$ and the fourth transistor $M_4$ respectively. By choosing $g_{m3}=g_{m4}$ $$i_{OUT-}=g_{m3}(v_1-v_2)=-g_{m3}(v_2-v_1)=-i_{OUT+} \qquad (3)$$

Thus well-balanced output currents are obtained.

At a frequency $f_0$ of interest, an input impedance $Z_{IN}$ of the amplifier 300 is designed to match the characteristic RF pre-selection filter impedance $R_s$, also called as a source resistance, usually $R_s=50\Omega$:

$$Z_{IN}(\omega_0)=R_s \qquad (4)$$

Where $\omega_0=2\pi f_0$. In addition, at the operation frequency of $f_0$, while impedance matched, i.e. the input impedance of the amplifier 300 is matched to the source resistance, or condition in Equation (4) is fulfilled, the magnitude of the differential output current can be approximated as $$|i_{OUT}(\omega_0)|=|i_{OUT+}-i_{OUT-}|=\\ 2|i_{OUT+}|=2g_{m1}|v_{GS1}|=2g_{m1}Qv_{IN} \qquad (5)$$

where $g_{m1}$ is the transconductance of the first transistor $M_1$, $v_{GS1}$ is the gate-source voltage of the first transistor $M_1$, and Q is a quality factor, Q-factor, of the input matching circuit 330 and is expressed as $$Q = \left|\frac{v_{GS1}(\omega_0)}{v_{IN}}\right| = \frac{|v_{GS1}(\omega_0)|}{v_{IN}} \qquad (6)$$

Accordingly, the equivalent transconductance of the amplifier 300 is given as $$G_m = \frac{|i_{OUT}(\omega_0)|}{v_{IN}} = 2g_{m1}Q \qquad (7)$$

It can be seen that Equation (7) describes how the single-ended input voltage $v_{IN}$ is converted to a differential output current $i_{OUT}$ and the conversion gain in terms of transconductance is $2 g_{m1}Q$.

Also, when impedance matched at the frequency of interest, an input current magnitude of the amplifier 300 is expressed as $$|i_{IN}(\omega_0)| = \frac{v_{IN}}{|Z_{IN}(\omega_0)|} = \frac{v_{IN}}{R_s} \qquad (8)$$

Thus, the amplifier 300 output current given by (5) is written as $$|i_{OUT}(\omega_0)|=2g_{m1}Qv_{IN}=2g_{m1}QR_s|i_{IN}(\omega_0)| \qquad (9)$$

Thus, a current gain of the amplifier 300 at impedance match is given as $$\left|\frac{i_{OUT}(\omega_0)}{i_{IN}(\omega_0)}\right| = 2g_{m1}QR_s \qquad (10)$$

In practice, $2g_{m1}QR_s \gg 1$ and thus $$|i_{OUT}(\omega_0)| \gg |i_{IN}(\omega_0)| \qquad (11)$$

Using the approximation expressed in Equation (11) at impedance match, the Kirchhoff's current law for node 3 can be written as $$v_3 Z_{GND}^{-1} \approx i_{OUT+}+i_{OUT-} \qquad (12)$$

Where, $v_3$ is a voltage across the parasitic ground impedance $Z_{GND}$. Since $i_{OUT+}=-i_{OUT-}$, thus $$v_3 Z_{GND}^{-1} \approx i_{OUT+}+i_{OUT-} \approx 0 \qquad (13)$$

and therefore $$v_3 \approx 0 \qquad (14)$$

Thus, the voltage across the parasitic ground impedance $Z_{GND}$ is close to zero. In other words, practically no current flows through $Z_{GND}$ at the operation frequency $f_0$. The residual RF current that flows thorough the parasitic ground impedance $Z_{GND}$ in the single-ended-to-differential amplifier 300 is due to the input current expressed in Equation (8). Compared to the current that flows via ground impedance in a truly single-ended inductively degenerated common-source amplifier, the parasitic ground RF current in the single-ended-to-differential amplifier 300 according to embodiments herein is a factor of $2g_{m1}QR_s$ smaller, i.e. the current gain expressed in Equation (10). As a result, in the single-ended-to-differential amplifier 300, the parasitic ground-impedance has only a minor effect, for example, on the equivalent transconductance, input matching and input impedance. This is beneficial, because inaccurately modeled Integrated Circuit (IC) package ground pins etc., will now have an ignorable effect on performance of the amplifier 300. As a result, the amplifier 300 according to embodiments herein may lower time-to-market due to an enhanced design cycle, as discussed above.

Figure 4:
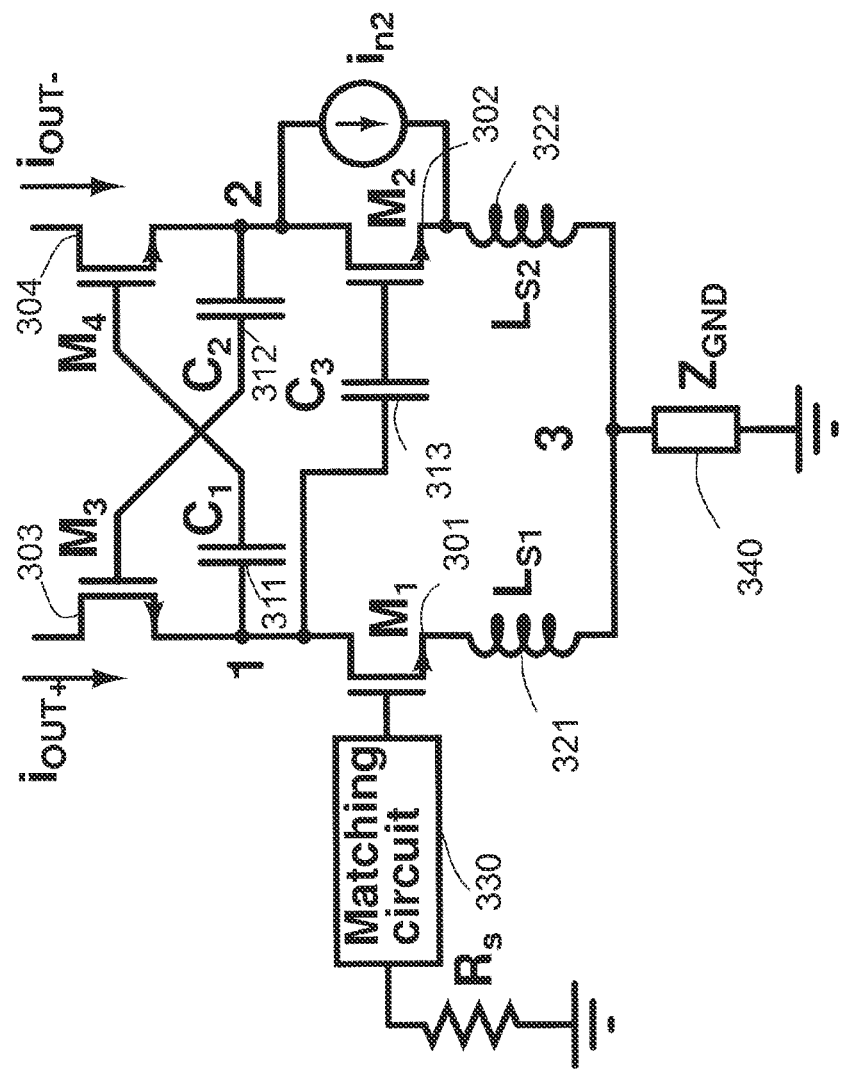
FIG. 4 is a schematic diagram illustrating an analysis model for the single-ended-to-differential amplifier shown in FIG. 3.

In the amplifier 300 herein, noise and nonlinearity due to the second transistor $M_2$ are cancelled at the output current. FIG. 4 shows an analyze model of the amplifier 300, the same reference numbers used in FIG. 3 are used in FIG. 4 for the same components. As shown in FIG. 4, the noise or weak nonlinearity due to the second transistor $M_2$ is represented by a current source of $i_{n2}$. Again, $Z_{GND}$ represents a parasitic ground impedance and $R_s$ is source resistance, usually $R_s=50\Omega$.

To analyze the output current $i_{OUT+}$ due to $i_{n2}$, the amplifier 300 input is connected to ground via the source resistor $R_s$. Now, the output currents are given by $$i_{OUT+} = g_{m3}(v_2 - v_1) = g_{m1}v_{GS1} \qquad (15)$$

$$i_{OUT-} = i_{n2} + g_{m2}v_{GS2} = g_{m4}(v_1 - v_2) \qquad (16)$$

Here, $v_1$ and $v_2$ are voltages at nodes 1 and 2, $v_{GS1}$ and $v_{GS2}$ are gate-source voltages of $M_1$ and $M_2$, and $g_{mi}$ is transconductance of transistor i, $M_i$, where i=1, 2, 3, 4. Moreover, the Kirchhoff's current law for node 3 can be written as $$v_3 Z_{GND}^{-1} = i_{OUT+} + i_{OUT-} = g_{m3}(v_2 - v_1 + v_1 - v_2) = 0 \quad (17)$$

where equations (15) and (16) have been used and $g_{m3}=g_{m4}$. Thus, again it is found that $v_3 \approx 0$ and thus $i_{n2}$ causes no current flowing via ground impedance $Z_{GND}$. Then also $v_{GS1}=0$ and $i_{OUT+}=0$, which implies that $v_1=v_2$, since $$i_{OUT+} = g_{m3}(v_2 - v_1) = 0 \quad (18)$$

As a result, also $i_{OUT-}=0$ according equation (16). Accordingly, the amplifier 300 output current shows no component due to noise or weak nonlinearity of the second transistor $M_2$ in the auxiliary branch. This is a clear advantage of the single-ended-to-differential amplifier 300 according to embodiments herein.

As discussed in the background, by employing a single-ended input LNA in a receiver of a wireless communication device, the number of package pins needed for the RFIC can be lowered and the PCB routing between the FEM and RFIC can be simplified. Accordingly, the PCB area and footprint can be reduced. As a result, lower cost and bills-of-material (BOM) can be achieved. The amplifier 300 according to embodiments herein has a single-ended input, therefore the amplifier 300 achieves above advantages.

In addition, the amplifier 300 according to embodiments herein minimizes signal currents at frequencies of interest both at the ground node of the inductively degenerated transistors, such as the first and second transistors $M_1$ and $M_2$, and at supply node. Accordingly, the effect of the non-ideal ground and supply impedances on conversion gain, input impedance, noise figure of the amplifier 300 etc. are minimized. Consequently, use of the amplifier 300 can lower time-to-market due to the enhanced design cycle.

Figure 5:
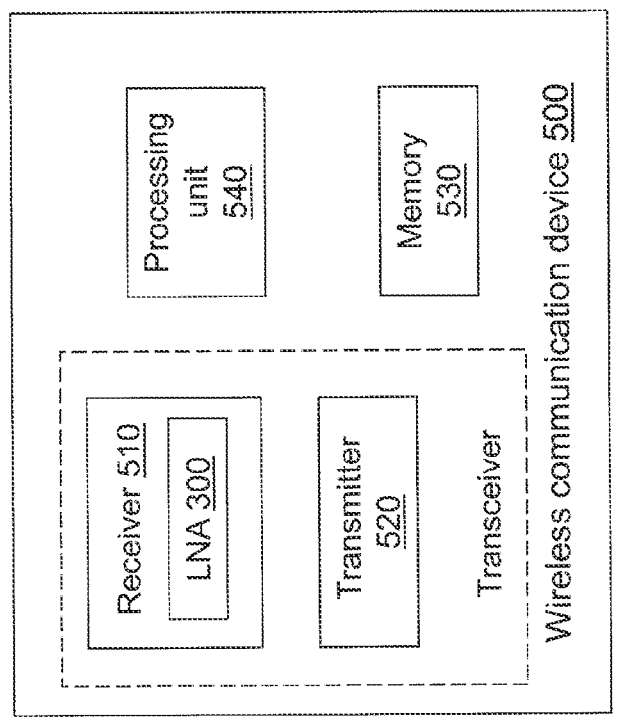
FIG. 5 is a block diagram illustrating a wireless communication device in which embodiments herein may be implemented.

The amplifier 300 according to embodiments herein converts the single-ended input signal to a differential output signal. The single-ended-to-differential conversion is performed in such a way, that it has minimal effect on the amplifier noise or linearity performance. This is due to the fact that the noise and nonlinearity due to the second or auxiliary branch of the amplifier 300 needed to generate the complementary output signal are cancelled at the differential output signal. Thus the amplifier 300 according to embodiments herein is suitable for using as an LNA in a receiver of a wireless communication device, as shown in FIG. 5, since its input impedance can be accurately matched to a characteristic impedance of an RF pre-selection filter. As shown in FIG. 5, the wireless communication device 500 comprises a Receiver 510, wherein the amplifier 300 may be implemented. The wireless communication device 500 further comprises a Transmitter 520, a Memory 530 and a Processing unit 540. Moreover, the amplifier 300 may be integrated on the same RFIC with rest of the Receiver 510 and it requires no expensive off-chip inductive balun circuits at the input of the amplifier 300 and no integrated balun circuits at the output of the amplifier 300.

The amplifier 300 according to embodiments herein is also suited for multiband receivers, since the single-ended-to-differential conversion itself is wideband while the amplifier 300 input impedance can be configured to match the RF filter output impedance at frequencies of interest. According some embodiments, a multiband receiver for operating at multiple frequency bands may comprise one or more radio-frequency filters configured to receive a single-ended input signal and to generate a single-ended output signal. The multiband receiver may further comprise one or more amplifiers 300 according to embodiments herein for converting a single-ended input signal, being the single-ended output signal generated from the radio-frequency filter, to a differential output signal. Further, input impedances of the one or more amplifiers 300 are configured to match output impedances of the one or more radio frequency filters at operating frequencies respectively.

Figure 6:
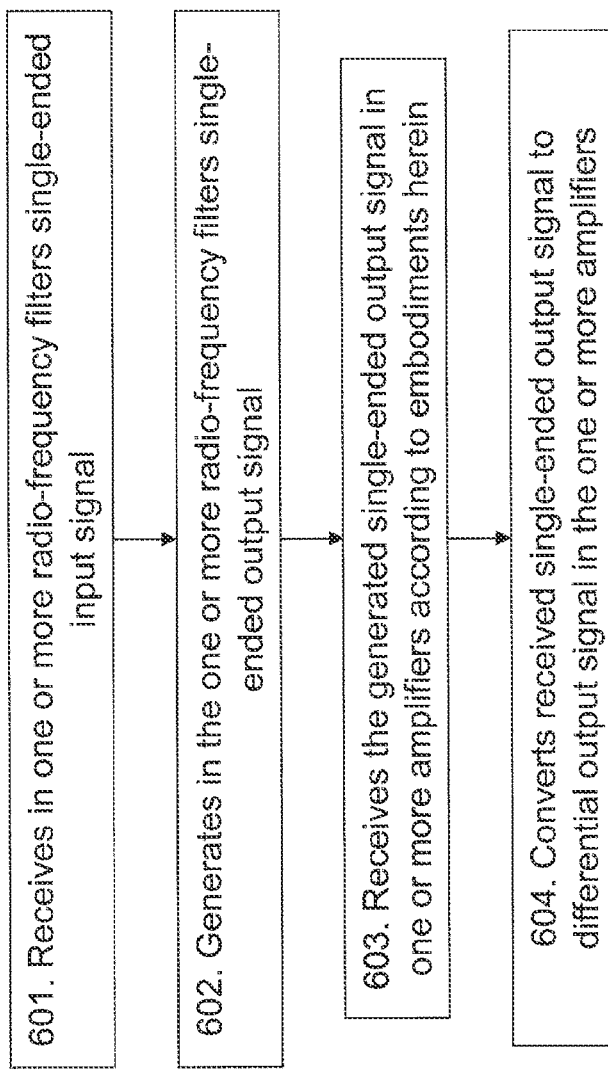
FIG. 6 is a flowchart depicting a method in a receiver according to embodiments herein.

Corresponding embodiments of a method in a receiver for operating at multiple frequency bands will now be described with reference to FIG. 6. As mentioned above, the receiver comprises one or more radio-frequency filters and one or more amplifiers 300. The method comprises following actions:

Action 601

The one or more radio-frequency filters receive a single-ended input signal.

Action 602

The one or more radio-frequency filters generate a single-ended output signal.

Action 603

The one or more amplifiers 300 receive the generated single-ended output signal.

Action 604

The one or more amplifiers 300 convert the received single-ended output signal to a differential output signal.

Those skilled in the art will understand that although the amplifier 300 is described with N-channel Metal-Oxide-Semiconductor (NMOS) devices, the amplifier 300 may comprise any other types of devices or transistors, such as Bipolar Junction Transistors (BJT), P-channel MOS (PMOS) devices, Complementary MOS (CMOS) devices etc. When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appending claims.

The invention claimed is:

1. An amplifier comprising a pair of inductively degenerated transistors that are configured to perform single-ended-to-differential conversion to convert a single-ended input signal to a differential output signal, wherein the single-ended-to-differential conversion is performed in such a way that noise and nonlinearity due to a second or auxiliary branch of the amplifier are cancelled in the differential output signal, wherein a source of each inductively degenerated transistor of the pair of inductively degenerated transistors is connected to a respective inductor, wherein the amplifier further comprises a third transistor and a fourth transistor, and wherein the third transistor and fourth transistor are cross-coupled to each other and connected to a first transistor and a second transistor of the pair of inductively degenerated transistors.

2. The amplifier of claim 1, wherein an input impedance of the amplifier is configured to match an output impedance of a radio frequency filter at a respective operating frequency.

3. The amplifier of claim 1, wherein the amplifier is a Low Noise Amplifier (LNA) of a receiver of a wireless communication device.

4. The amplifier of claim 1, wherein the first transistor is configured in common-source or common-emitter mode, to receive the single-ended input signal and generate a first part of the differential output signal, a source or emitter of the first transistor being connected to a first end of a first inductor, and a gate or base of the first transistor being coupled to the single-ended input signal.

5. The amplifier of claim 4, wherein the second transistor is configured in common-source or common-emitter mode, to generate a second part of the differential output signal, a source or emitter of the second transistor being connected to a first end of a second inductor.

6. The amplifier of claim 5, wherein:
   a drain or collector of the first transistor is coupled to a gate or base of the fourth transistor via a first capacitor;
   a drain or collector of the second transistor is coupled to a gate or base of the third transistor via a second capacitor;
   the drain or collector of the first transistor is connected to a source or emitter of the third transistor, the drain or collector of the second transistor is connected to a source or emitter of the fourth transistor; and
   the drain or collector of the first transistor is coupled to a gate or base of the second transistor directly or via a third capacitor.

7. A method in a receiver for operating at multiple frequency bands, the method comprising: receiving in one or more radio-frequency filters, a single-ended input signal; generating in the one or more radio-frequency filters, a single-ended output signal based on the single-ended input signal; receiving the generated single-ended output signal in one or more amplifiers; and converting, by a pair of inductively degenerated transistors in the one or more amplifiers, the single-ended output signal to a differential output signal in the one or more amplifiers, wherein input impedances of the one or more amplifiers are configured to match output impedances of the one or more radio frequency filters at respective operating frequencies, wherein a source of each inductively degenerated transistor of the pair of inductively degenerated transistors is connected to a respective inductor, wherein an amplifier of the one or more amplifiers further comprises a third transistor and a fourth transistor, and wherein the third transistor and fourth transistor are cross-coupled to each other and connected to a first transistor and a second transistor of the pair of inductively degenerated transistors.

8. The method of claim 7, wherein noise and nonlinearity due to a second branch of the one or more amplifiers are cancelled in the differential output signal.

9. The method of claim 7, further comprising:
   controlling an input impedance of the one or more amplifiers to match an output impedance of the one or more radio-frequency filters at respective operating frequencies.

10. A wireless communication device comprising a receiver, the receiver comprising an amplifier comprising a pair of inductively degenerated transistors that are configured to perform single-ended-to-differential conversion to convert a single-ended input signal to a differential output signal, wherein the single-ended-to-differential conversion is performed in such a way that noise and nonlinearity due to a second or auxiliary branch of the amplifier are cancelled in the differential output signal, wherein a source of each inductively degenerated transistor of the pair of inductively degenerated transistors is connected to a respective inductor, wherein the amplifier further comprises a third transistor and a fourth transistor, and wherein the third transistor and fourth transistor are cross-coupled to each other and connected to a first transistor and a second transistor of the pair of inductively degenerated transistors.

11. The wireless communication device of claim 10, wherein the receiver is a multiband receiver.

* * * * *